US007924965B2

(12) United States Patent
Tseng et al.

(10) Patent No.: US 7,924,965 B2
(45) Date of Patent: Apr. 12, 2011

(54) CLOCK GENERATOR, MULTIMODULUS FREQUENCY DIVIDER AND DETA-SIGMA MODULATER THEREOF

(75) Inventors: Wei-Sheng Tseng, Nantou County (TW); Hong-Yi Huang, Taipei (TW); Kuo-Hsing Cheng, Taipei (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/391,263

(22) Filed: Feb. 24, 2009

(65) Prior Publication Data

US 2010/0164562 A1    Jul. 1, 2010

(30) Foreign Application Priority Data

Dec. 26, 2008   (TW) ................................ 97151134 A

(51) Int. Cl.
*H03K 21/00*     (2006.01)
(52) U.S. Cl. ........................................... 377/47; 377/48
(58) Field of Classification Search .................. None
See application file for complete search history.

(56) References Cited

U.S. PATENT DOCUMENTS

| | | | | | |
|---|---|---|---|---|---|
| 5,510,742 | A | * | 4/1996 | Lemaire | 327/146 |
| 6,157,694 | A | * | 12/2000 | Larsson | 377/48 |
| 6,542,013 | B1 | * | 4/2003 | Volk et al. | 327/115 |
| 6,583,674 | B2 | * | 6/2003 | Melava et al. | 331/16 |
| 6,671,341 | B1 | * | 12/2003 | Kinget et al. | 375/373 |
| 6,760,398 | B2 | * | 7/2004 | Casagrande | 377/47 |
| 7,035,367 | B2 | * | 4/2006 | Melava | 375/376 |
| 7,486,145 | B2 | * | 2/2009 | Floyd et al. | 331/1 A |
| 7,551,009 | B2 | * | 6/2009 | Garlapati et al. | 327/115 |
| 2008/0094113 | A1 | * | 4/2008 | Kuan | 327/117 |
| 2009/0296878 | A1 | * | 12/2009 | Tsai | 377/47 |
| 2009/0302900 | A1 | * | 12/2009 | Marutani | 327/117 |

OTHER PUBLICATIONS

Article Titled "A Spread Spectrum Clock Generator for SATA-II," jointly authored by Chen et al., in IEEE, Mar. 2005 (pp. 2643-2646).
Article Titled "A Spread Spectrum Clock Generator With Triangular Modulation," jointly authored by Chang et al., in IEEE J. Solid-State Circuits, vol. 38, Apr. 2003 (pp. 673-676).
Article Titled "A Low-Jitter Added SSCG with Seamless Phase Selection and Fast AFC for 3rd Generation Serial-ATA," jointly authored by Shin et al., in IEEE Custom Intergrated Circuits Conferences, 2006 (pp. 409-412).
Article Titled "A Low-Jitter 5000ppm Spread Spectrum Clock Generator for Multi-Channel SATA Transceiver in 0.18 μm CMOS," jointly authored by Lee et al., in IEEE International Solid-State Circuits Conference, Feb. 8, 2005 (pp. 162-163).

* cited by examiner

*Primary Examiner* — Tuan Lam
(74) *Attorney, Agent, or Firm* — Jianq Chyun IP Office

(57) ABSTRACT

A clock generator is illustrated. The clock generator mentioned above includes a multimodulus frequency divider and a delta-sigma modulator. The multimodulus frequency divider is archived by switching the phase thereof. The multimodulus frequency divider increases the operating frequency of the clock generator effectively, and has a characteristic with half period resolution for reducing the jitter of an output clock signal when its spectrum is spread. Besides, the delta-sigma modulator increases the accuracy of the triangle modulation and reduces error of quantization by adding a few components therein. Thus, the clock generator could be expanded to a programmable clock generator.

24 Claims, 14 Drawing Sheets

340

CLOCK GENERATOR, MULTIMODULUS FREQUENCY DIVIDER AND DETA-SIGMA MODULATER THEREOF

CROSS-REFERENCE TO RELATED APPLICATION

This application claims the priority benefit of Taiwan application serial no. 97151134, filed Dec. 26, 2008. The entirety of the above-mentioned patent application is hereby incorporated by reference herein and made a part of specification.

BACKGROUND OF THE INVENTION

1. Field of Invention

The present invention generally relates to a clock generator, and more particularly to a clock generator for providing a spread spectrum output clock signal.

2. Description of Prior Art

In the field of the high speed transmission, the phenomenon in the system, such as error occurrence or abnormally functioning, may happen due to the period signal having the centralized and strong energy. The energy is a form of electromagnetism, and also called as electromagnetic interference (EMI). Recently, a technology of spectrum expansion is used to reduce the electromagnetic interference, which is also called as a spread spectrum technology. The spread spectrum technology makes the frequency of the clock signal distributed in a certain range, so as to diverse the energy of the clock signal, and to reduce the energy of the interference. Generally, the clock generators using the spread spectrum technology can be divided into three categories.

Referring to FIGS. 1A-1C and FIGS. 1A-1C are block diagrams of conventional clock generators of three categories. The spread spectrum clock generator in FIG. 1A receives the input clock signal FIN, and uses the low pass filter (LPF) 110 to perform a direct modulation. Then the spread spectrum clock generator changes the frequency of the output clock signal FOUT by changing the control voltage generated by the low pass filter 110. Most of the spread spectrum clock generators of this category need passive components of the larger size, so as to obtain the better stability control. However the passive components of the larger size consume the larger area and cost, and have the higher sensitivity for the process, the temperature and the voltage.

In FIG. 1B, the delta-sigma phase switching or the phase compensation is used to construct the spread spectrum clock generator 120, and thus the spread spectrum clock generator 120 can adjust the frequency of the output clock signal. The spread spectrum clock generator of this category uses the little phase deviation to perform a modulation, and therefore it has the smaller jitter. However, while operating in the high frequency condition, it is hard to obtain the accurate phase due to the effect of the parasitical capacitor and the parasitical resistor on the unmatched winding wire.

In addition, the spread spectrum clock generator in FIG. 1C is the spread spectrum clock generator of the third category which uses the fractional frequency dividing to perform a modulation. The multimodulus frequency divider 130 thereof has two or more than two moduluses and multiples the frequency of the output clock signal FOUT with a fraction number via the switching control of a certain ratio made by the spread spectrum modulator 140.

Take the spread spectrum clock generator in FIG. 1C as an example, the switch between the several moduluses is needed when the fractional frequency dividing is processed. The switch between the several moduluses is occurred in the fixed period. Though the effect of the average fractional frequency dividing is achieved, the phase detector 150 generates an error signal at the moment of the switch between the several moduluses. The error signal will affect the voltage controlled oscillator 160, change the frequency of the output clock signal FOUT, and generate a fractional spike in the spectrum.

Moreover, the spread spectrum modulator 140 used to control the multimodulus frequency divider 130 is usually constructed by the delta-sigma modulator, and the effect of the spread spectrum is determined by the bit width of the delta-sigma modulator. The higher the bit width is, and the smaller the quantization error can be obtained. Referring to FIG. 2, FIG. 2 is a wave diagram of the spread spectrum control voltage signal. The larger the bit width of the sigma-delta modulator is, the higher resolution thereof can be obtained, and the smoother the triangle wave 210 is. Therefore, a better effect of the spread spectrum is achieved.

SUMMARY OF THE INVENTION

In exemplary embodiments consistent with the present invention, there is provided a multimodulus frequency divider which comprises at least a multimodulus frequency dividing unit, and the multimodulus dividing unit comprises at least an input phase selection unit, at least a frequency dividing and phase generating unit, at least a phase selection control unit, and at least a phase state selection unit. The input phase selection unit receives a plurality of synchronous input signals and a selection signal, and selects a phase of one synchronous input signal among the synchronous input signals in response to the selection signal, so as to generate a selected synchronous input signal. The frequency dividing and phase generating unit is coupled to the input phase selection unit, and is used to receive the selected synchronous input signal and to divide a frequency of the selected synchronous input signal, so as to obtain an output multimodulus frequency dividing signal. In addition, the phase selection control unit is coupled to the frequency dividing and phase generating unit, and is used to receive the output multimodulus frequency dividing signal and a control signal, and to take the output multimodulus frequency dividing signal and the control signal into a logic calculation, so as to generate a feedback signal. The phase state selection unit is coupled to the phase selection control unit, and is used to change a state of the selection signal into another state or maintain the state of the selection signal in response to whether the feedback signal is triggered or not, so as to generate a recording phase signal.

In exemplary embodiments consistent with the present invention, there is provided a sigma-delta modulator, and the sigma-delta modulator comprises at least a sigma-delta modulating unit. The sigma-delta modulating unit comprises at least a frequency dividing circuit, at least an accumulator, at least a pulse width adjusting circuit, and at least a data calculating device. The frequency dividing circuit receives an input clock signal, and divides a frequency of the input clock signal, so as to generate a frequency dividing clock signal. The accumulator is coupled to the frequency dividing circuit, and is used to receive the frequency dividing clock signal, and to accumulate a fractional part input signal in response to the frequency dividing clock signal, so as to generate a quantized output signal and an output overflow signal. The pulse width adjusting circuit is coupled to the accumulator. The pulse width adjusting circuit is used to receive the output overflow signal and the frequency dividing clock signal, and to adjust the pulse width of the output overflow signal in response to a period of the frequency dividing clock signal, so as to generate a width adjusted output overflow signal. The data calculating device is coupled to the pulse width adjusting circuit, and is used to take the width adjusted output overflow signal and an integral part input signal into an algorithmic calculation, so as to generate an control signal In exemplary embodiments consistent with the present invention, there is provided a clock generator which is constructed by a phase locked loop circuit and used to generate an output clock signal in response to an input clock signal and a feedback clock signal. The feedback clock signal and the output clock signal have a multiple relation, and the clock generator comprises the multimodulus frequency divider mentioned above.

In exemplary embodiments consistent with the present invention, there is provided another one clock generator which is constructed by a phase locked loop circuit and used to generate an output clock signal in response to an input clock signal and a feedback clock signal. The feedback clock signal and the output clock signal have a multiple relation, and the clock generator comprises the multimodulus frequency divider and the sigma-delta modulator mentioned above.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention as recited in the appended claims.

In exemplary embodiments consistent with the present invention provides a multimodulus frequency divider which is used to generate a relation of the output multimodulus frequency dividing signal and the input signal.

In exemplary embodiments consistent with the present invention provides a sigma-delta modulator which is used to calculate an integral part input signal and a fractional part input signal, so as to generate an output overflow signal.

In exemplary embodiments consistent with the present invention respectively provide two clock generators which are used to dynamically adjust the frequency of the output clock signal.

Figure 1A:
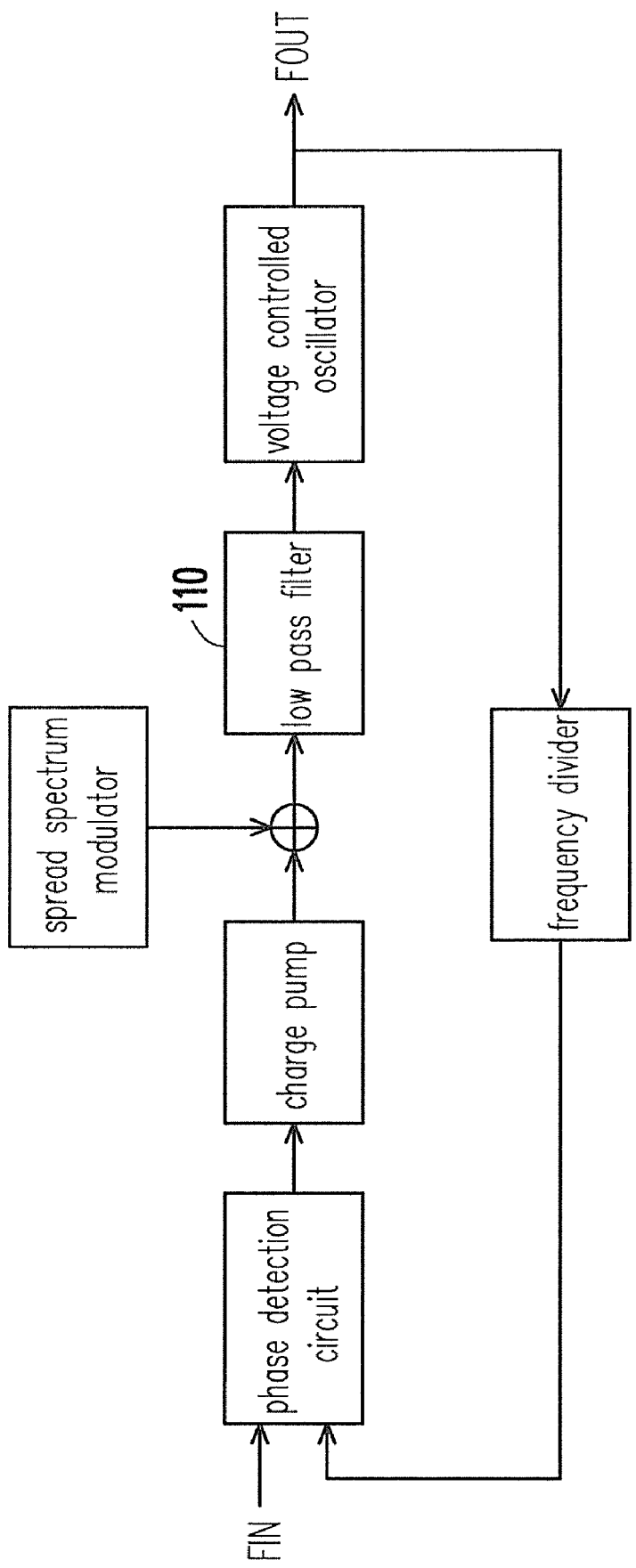
FIGS. 1A-1C are block diagrams of conventional clock generators of three categories.
Figure 1B:
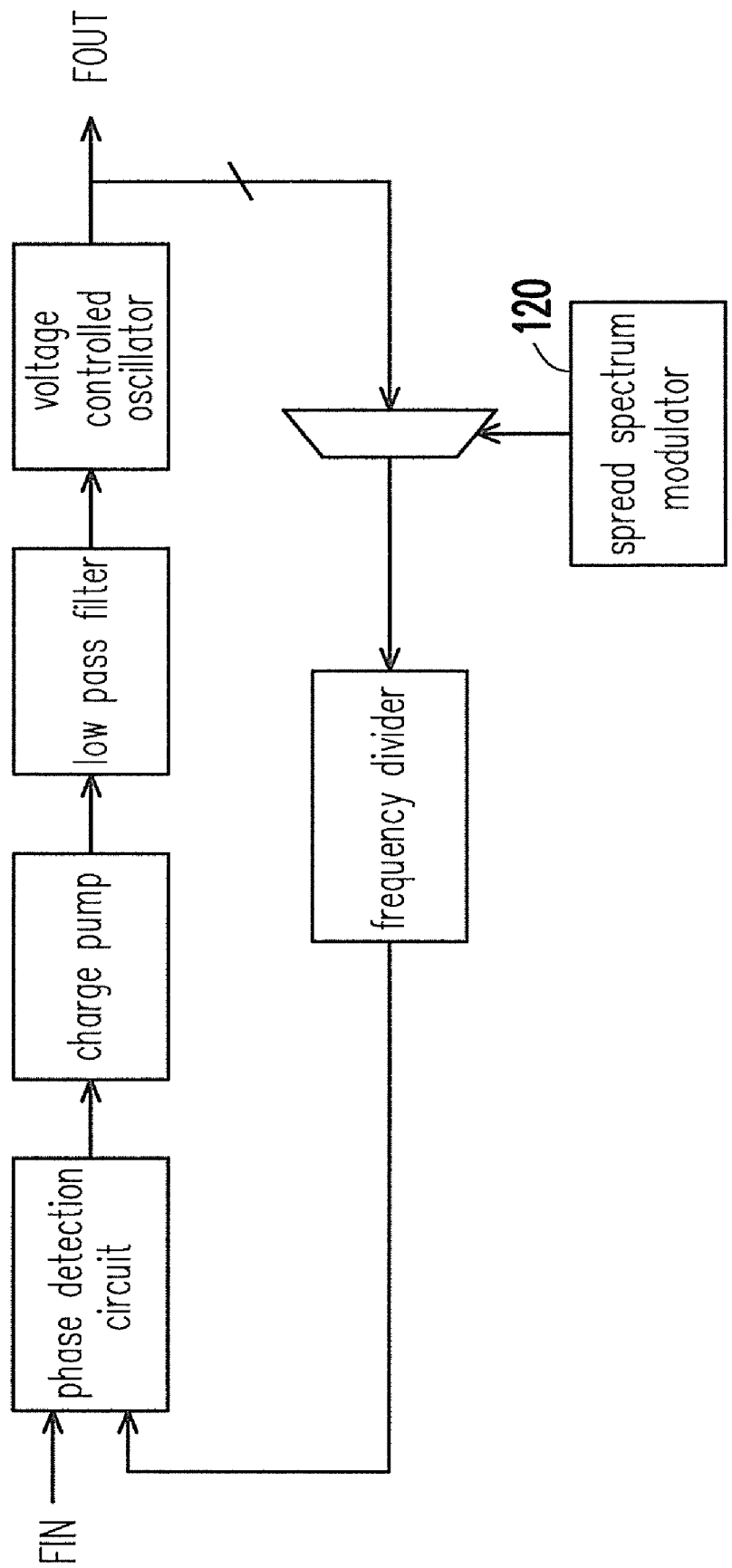
Figure 1C:
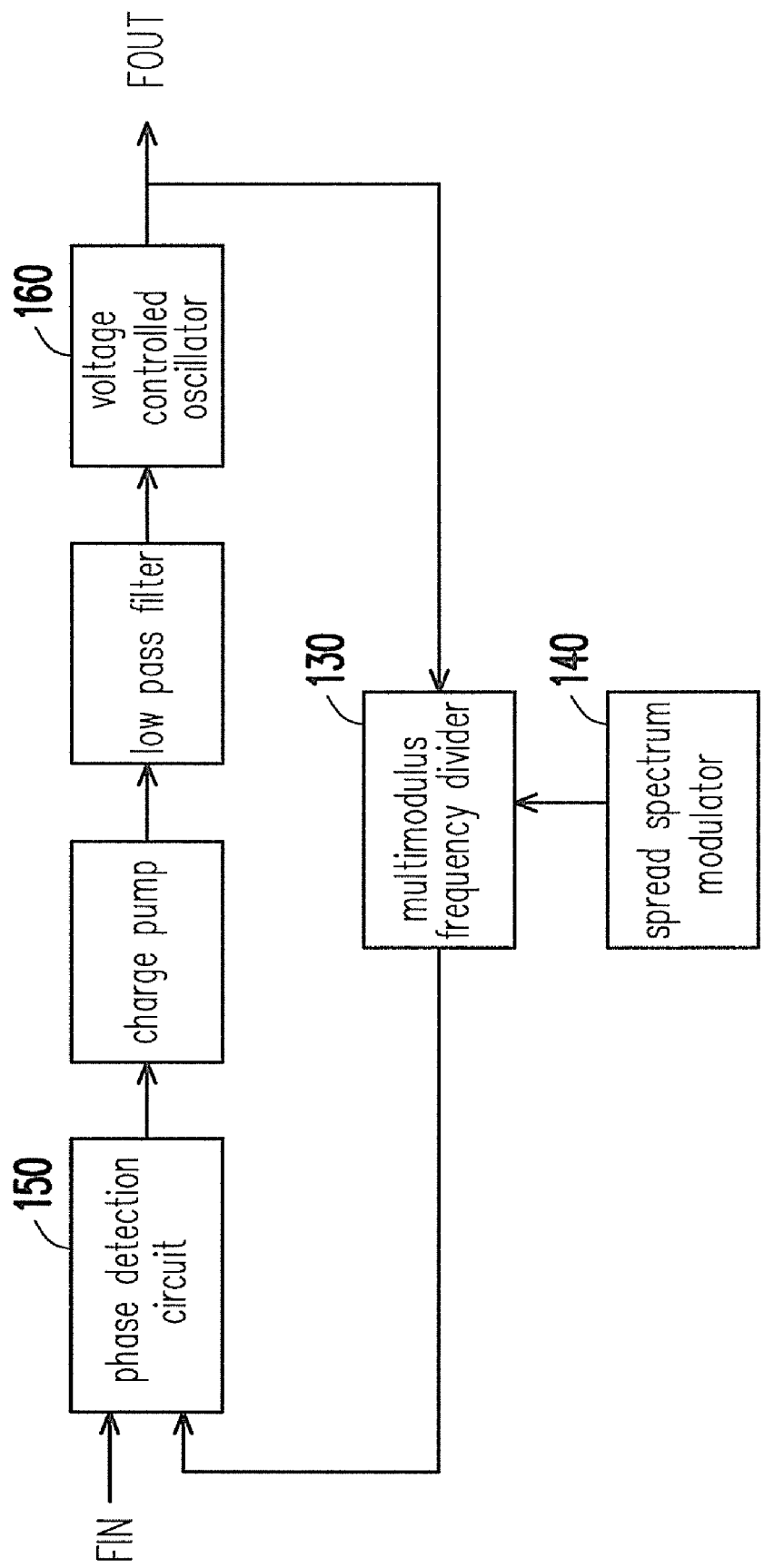
Figure 2:
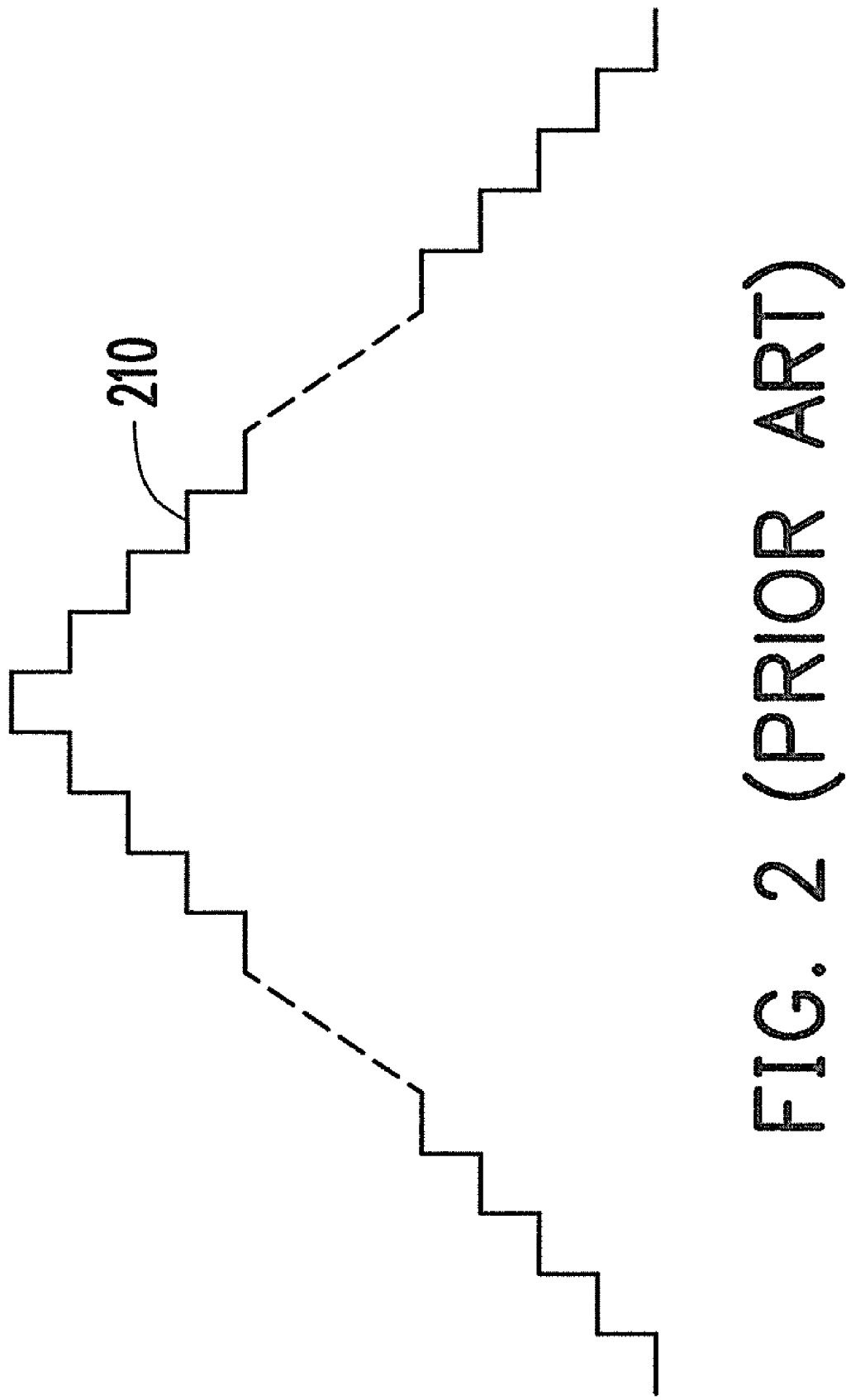
FIG. 2 is a wave diagram of the spread spectrum control voltage signal.
Figure 3:
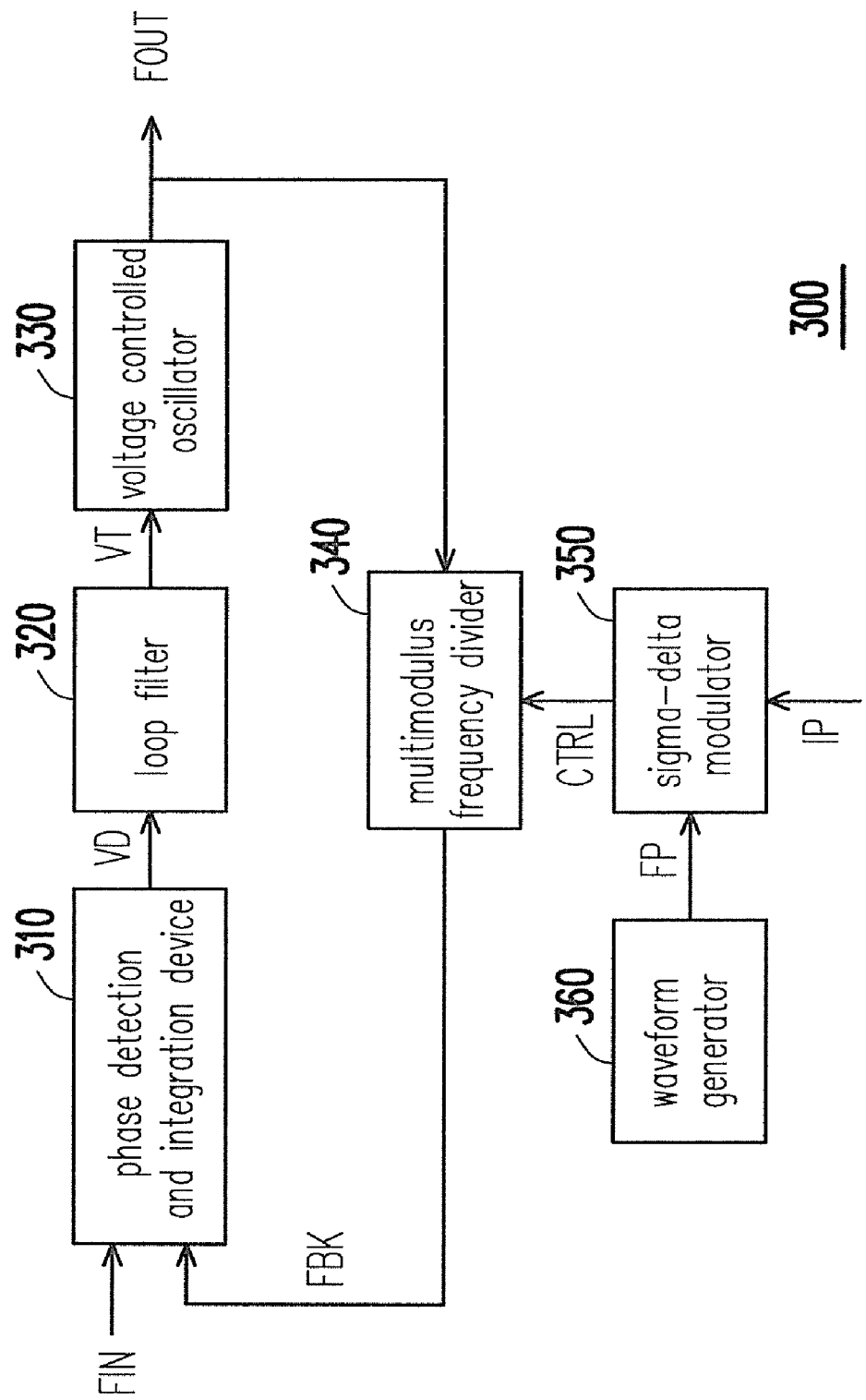
FIG. 3 is a block diagram of a clock generator provided by the embodiment of the present invention.

First, referring to FIG. 3, FIG. 3 is a block diagram of a clock generator provided by the embodiment of the present invention. The clock generator 300 is constructed by the phase locked loop (PLL) circuit, and comprises a phase detection and integration device 310, a loop filter 320, a voltage controlled oscillator (VCO) 330, a multimodulus frequency divider 340, a sigma-delta modulator 350, and a waveform generator 360. The phase detection and integration device 310 receives the input clock signal FIN and the feedback clock signal FBK, and detects the deviation between both of them. When a frequency of the input clock signal FIN is higher than that of the feedback clock signal, the internal end of the phase detection and integration device 310 generates a pulse with a positive value; by contrast, when the frequency of the input clock signal FIN is lower than that of the feedback clock signal, the internal end of the phase detection and integration device 310 generates the pulse with a negative value.

The phase detection and integration device 310 integrates the pulses generated by the foregoing manner, so as to generate a differential voltage VD, wherein the integration is usually done by the process of charge pump. Then, the differential voltage VD is input into the loop filter 320, so as to generate a control voltage VT, wherein the control voltage is an input of the voltage controlled oscillator 330. The charge pump and the loop filter are known and understood by the person having the general acknowledge in the field, and thus they are not described in detail herein.

The multimodulus frequency divider 340 is coupled to the voltage controlled oscillator 330, and is used to receive the output clock signal FOUT, so as to generate a feedback clock signal FBK. The output clock signal FOUT and the feedback clock signal have a multiple relation, and the multiple relation is determined a control signal CTRL. When the clock generator 300 operates stably, the input clock signal FIN and the output clock signal FOUT have the multiple relation same as that of the output clock signal FOUT and the feedback clock signal FBK. The clock generator dynamically adjusts the multiple relation in response to the control signal CTRL, so as to change the frequency of the output clock signal FOUT, and to achieve the spread spectrum function.

The sigma-delta modulator 350 is coupled to the multimodulus frequency divider 340, and is used to determine the control signal which is used to determine the multiple relation. The sigma-delta modulator 350 receives a signal set of an integral part input signal IP and a fractional part input signal FP. The sigma-delta modulator 350 is further coupled to the waveform generator 360, and the waveform generator 360 is used to provide the fractional signal FP of the frequency dividing modulus.

Next, different embodiments of the multimodulus frequency divider 340 and the sigma-delta modulator 350 in the clock generator 300 are provided, so as to illustrate the operation of the clock generator 300.

Figure 4A:
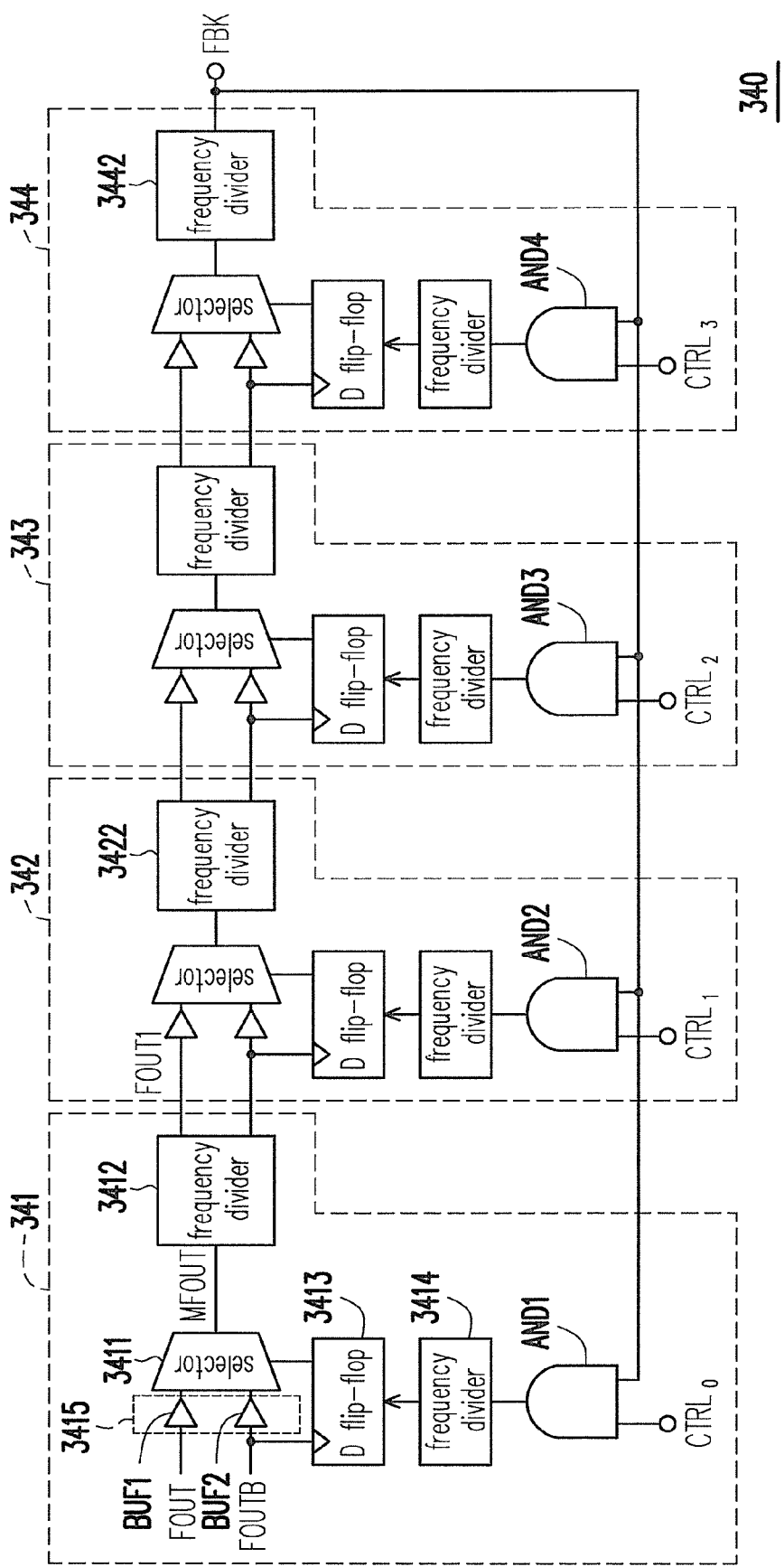
FIG. 4A is a circuit diagram of the multimodulus frequency divider 340 according to one embodiment of the present invention.

Referring to FIG. 4A, FIG. 4A is a circuit diagram of the multimodulus frequency divider 340 according to one embodiment of the present invention. The multimodulus frequency divider 340 comprises a plurality of multimodulus frequency dividing units. In this embodiment, the multimodulus frequency divider 340 comprises four multimodulus frequency dividing units 341-344, however the number of the multimodulus frequency dividing units is not limited thereto in the present invention. The structures of the multimodulus frequency dividing units 341-344 are similar to each other. Take the multimodulus frequency dividing unit 341 as an example, the multimodulus frequency dividing unit 341 comprises an and-gate AND1, selector 3411, a delay buffer 3415, a frequency divider 3412, a D flip-flop 3413 and a frequency divider 3414.

The delay buffer 3415 constructs an input phase synchronization unit, and the selector 3411 constructs an input phase selection unit. The frequency divider 3412 constructs a frequency dividing and phase generating unit, and the D flip-flop 3413 constructs a phase selection signal synchronization unit. The frequency divider 3414 constructs a phase state selection unit, and the and-gate AND1 constructs a phase selection control unit.

In addition, the input phase synchronization unit is used to receive a plurality of input signals, and to synchronize the received input signals, so as to generate a plurality of synchronous input signals, and the phase differences (i.e. phase errors) between these synchronous input signals are not equal to zero. The input phase selection unit receives these synchronous input signals and a selection signal, and selects a phase of one synchronous input signal among these synchronous input signals in response to the selection signal, so as to generate a selected synchronous input signal. The frequency dividing and phase generating unit receives the selected synchronous input signal, and divides a frequency of the selected synchronous input signal, so as to obtain an output multimodulus frequency dividing signal. The phase selection control unit receives the output multimodulus frequency dividing signal and a control signal, and takes the output multimodulus frequency dividing signal and the control signal into a logic calculation, so as to generate a feedback signal. The phase state selection unit changes a state of the selection signal into another state or maintains the state of the selection signal in response to whether the feedback signal is triggered or not, so as to generate a recording phase signal. Last the phase selection signal synchronization unit synchronizes the recording phase signal in response to one of the input signals, so as to generate the selection signal.

The selector 3411 in the first multimodulus frequency dividing unit 341 receives the output clock signal FOUT and the inversed output clock signal FOUTB of the clock generator 300. The phase deviation of the output clock signal FOUT and the inversed output clock signal FOUTB is 180° rather than 0°. The output clock signal FOUT and the inversed output clock signal FOUTB are input into the selector 3411 via the delay buffer 3415. The output end of the selector 3411 is coupled to the frequency divider 3412, and is used to output the selection clock signal MFOUT. The selection end of the selector 3411 is coupled to the D flip-flop 3413. Furthermore, the D flip-flop 3413 is coupled to the output end of the frequency divider 3414, and the input end of the frequency divider 3414 is coupled to the output end of the and-gate AND1. One input end of the and-gate AND1 is coupled to the control signal $CTRL_0$, and the other end of the and-gate AND1 is coupled to the input ends of the and-gate AND2-AND4 for receiving the feedback clock signal FBK. The feedback clock signal FBK is generated by the output end of the frequency divider 3442 in the last multimodulus frequency dividing unit 344.

In addition, the input end of each selector in the multimodulus frequency dividing units 341-344 is further coupled to the delay buffer in cascade. Take the multimodulus frequency dividing unit 341 as an example; the input end of the selector 3411 is coupled to the delay buffer 3415 in cascade. The delay buffer 3415 is constructed by two delay units BUF1 and BUF2, and the delay units BUF1 and BUF2 are used to respectively delay the transmitting time to the selector 3411 of the output clock signal FOUT and that of the inversed output clock signal FOUTB.

Figure 4B:
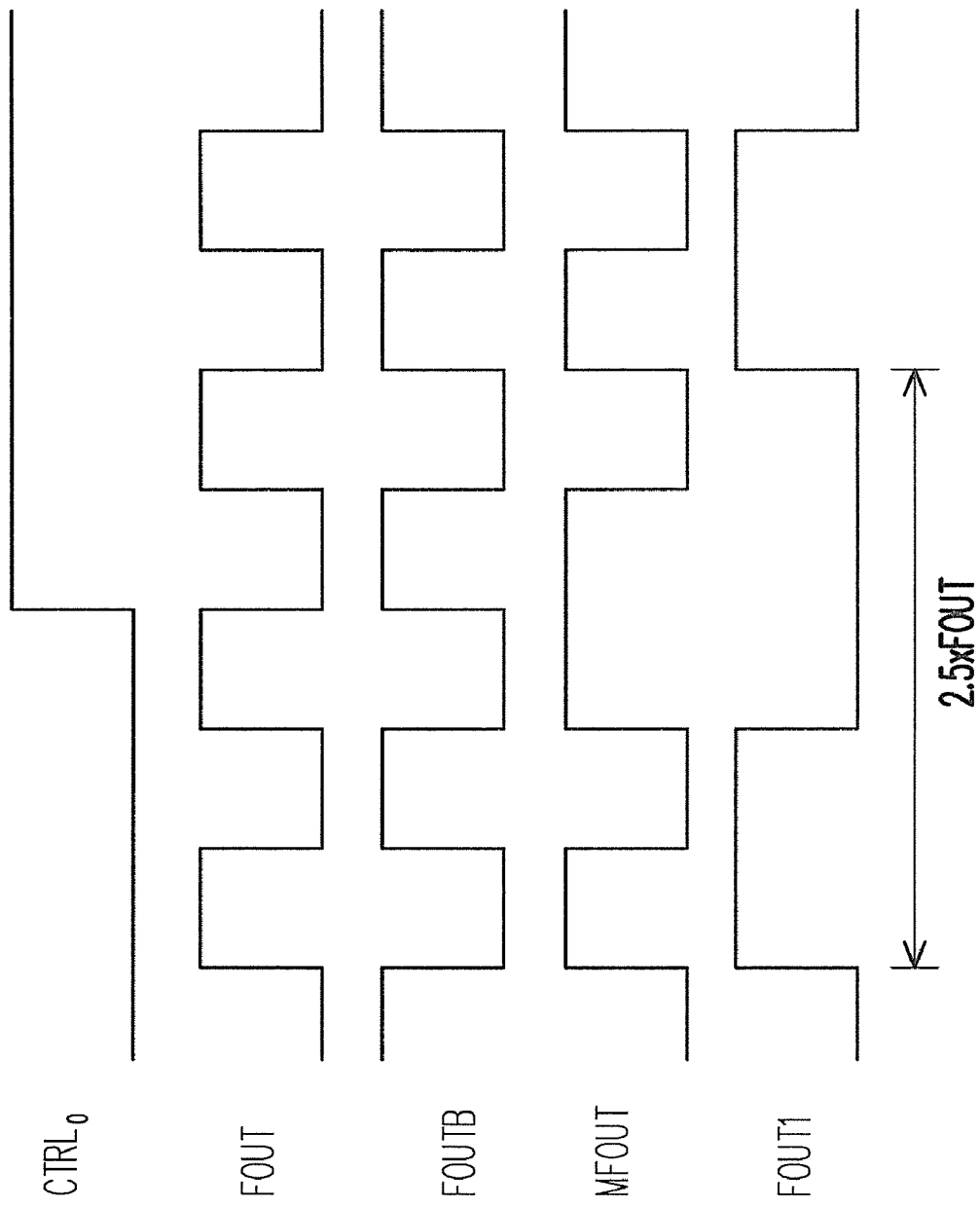
FIG. 4B is a waveform diagram of the waveforms of the multimodulus frequency divider 340.

Regarding detail of the operation in the multimodulus frequency divider 340, the dividing factor is changed from 2 to 2.5 by switching the output clock signal FOUT and that of the inversed output clock signal FOUTB. Referring to FIG. 4B, FIG. 4B is a waveform diagram of the divider unit 341 in multi-modulus divider 340. To know the operation concept of the single stage, such as the multimodulus frequency dividing unit 341, please refer to FIGS. 4A and 4B. The and-gate AND1 in the multimodulus frequency dividing unit 341 is used to determine whether the control phase is switched. When the control signal $CTRL_0$ received by the and-gate AND1 is logic low, "0", the feedback signal FBK received by the and-gate AND1 is not transmitted into the multimodulus frequency dividing unit 341. That is, the phase of the output clock signal FOUT is not switched. When the control signal $CTRL_0$ received by the and-gate AND1 is logic high, "1", the feedback signal FBK received by the and-gate AND1 is transmitted into the multimodulus frequency dividing unit 341. That is, the phase of the output clock signal FOUT is switched.

In the embodiment, the frequency divider 3414 is used to divide the frequency of its input by 2, so as to record and change the selected phase. The D flip-flop 3413 is a flip-flop for synchronization. The D flip-flop 3413 synchronizes the phase of the selection signal with the input signal phases. The circuit of delay buffer 3415 is similar to the circuit from the input clock end to the output end of the D flip-flop 3413, and the delay buffer 3415 is used to synchronize the phases of input signals with the selection signal phase. The frequency divider 3412 divide the frequency of the output signal MFOUT output form the selector 3411.

In the single stage case with the multimodulus frequency dividing unit 341, when the control signal $CTRL_0$ is logic high, "1", the period of the output clock signal FOUT1 of the frequency divider 3412 is 2.5 times the period of the output clock signal FOUT, and it is shown in FIG. 4B.

It is noted that, due to the cascade connection of the multimodulus frequency dividing unit 341-344, the phase switching variation provided by the frequency divider 3422 is two times the phase switching variation provided by the frequency divider 3412 when the frequency dividers 3412 and 3422 have the dividing factor of 2. That is, the phase switching variation provided by the frequency divider 3422 is one period, and the phase switching variations provided by the other frequency dividers can be deduced in this manner.

Accordingly, a relation between the frequency dividing factor DN and the control signals $CTRL_0$-$CTRL_{N-1}$ is obtained and shown as:

$$DN=2^N+\{2^{N-1}\times CTRL_{N-1}+\ldots+2^1\times CTRL_1+2^0\times CTRL_0\}\times 0.5 \qquad 5$$

Therefore, in the embodiment, the multimodulus frequency divider 340 (N=4) has a half period resolution for reducing the jitter of the control voltage to be 0.5 times when its spectrum is spread. Thus the output jitter of the voltage controlled oscillator is reduced. When the control signals $CTRL_0$-$CTRL_3$ are respectively equal to 1, 0, 0, and 0, the frequency dividing factor DN is 16+1×0.5=16.5.

Figure 5A:
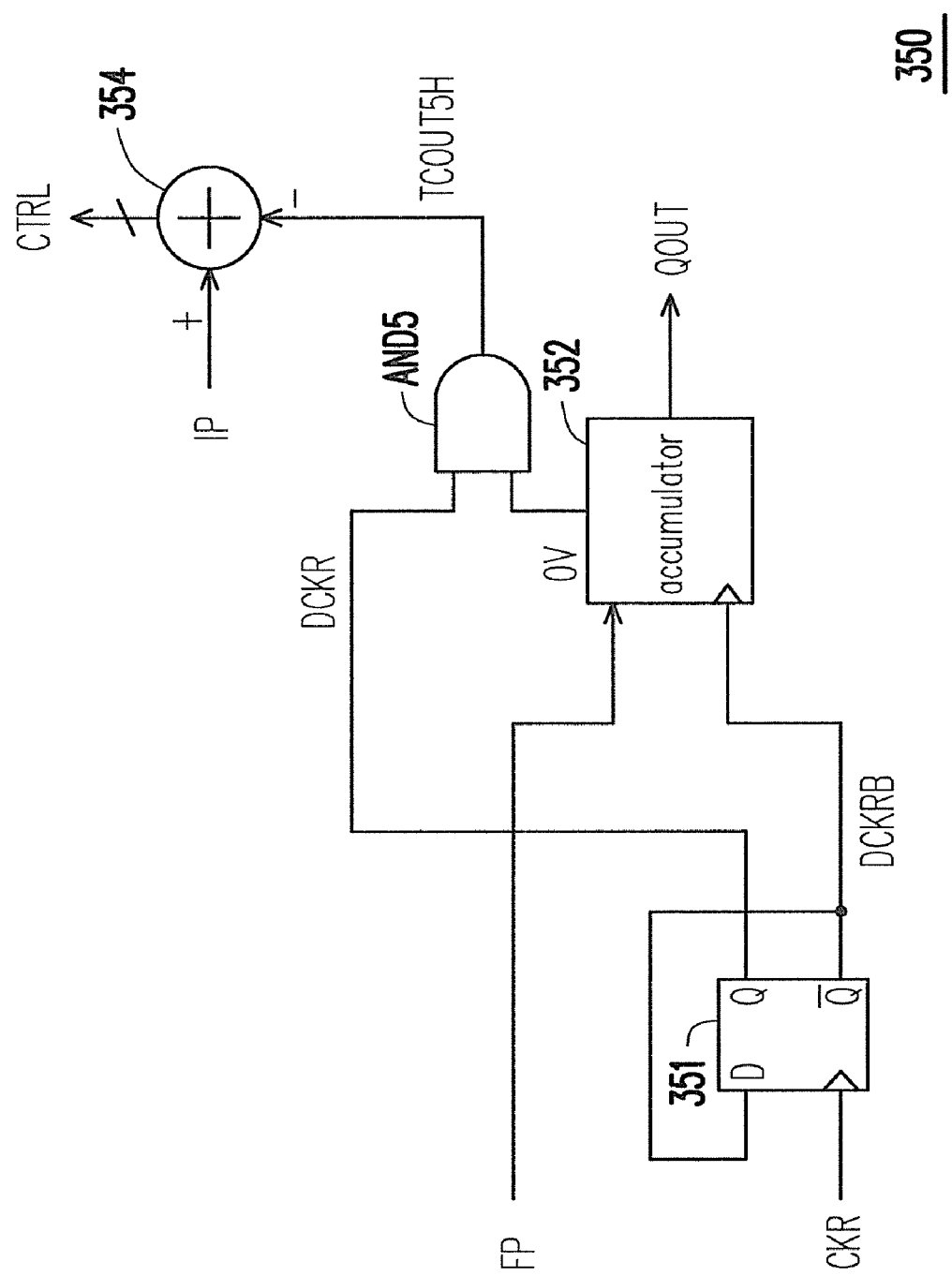
FIG. 5A is a circuit diagram of the sigma-delta modulator 350 according to one embodiment of the present invention.

Next, referring to FIG. 5A, FIG. 5A is a circuit diagram of the sigma-delta modulator 350 according to one embodiment of the present invention. The sigma-delta modulator 350 comprises a frequency divider 351, an accumulator 352, an and-gate AND5 which forms a pulse width adjusting circuit, and a data calculating device 354. The frequency divider receives a reference clock signal CKR and divides a frequency of the reference clock signal CKR, so as to generate a frequency dividing reference clock signal DCKR and an inversed frequency dividing reference clock signal DCKRB. In the embodiment, the frequency divider 351 is implemented by a D flip-flop connected as a T flip-flop. Thus this D flip flop functions as a frequency divider for dividing the frequency of the reference clock signal CKR with a dividing factor of 2. The accumulator 352 receives a fractional part input signal FP, and accumulates the fractional part input signal FP in response to the inversed frequency dividing reference clock signal DCKRB, so as to generate a quantized output signal QOUT and an output overflow signal OV. The output end of the and-gate AND5 is coupled to the data calculating device 354. In the embodiment, the data calculating device 354 is a subtractor, which is used to subtract the output overflow signal OV generated by the accumulator 352 from the integral part input signal IP.

Figure 5B:
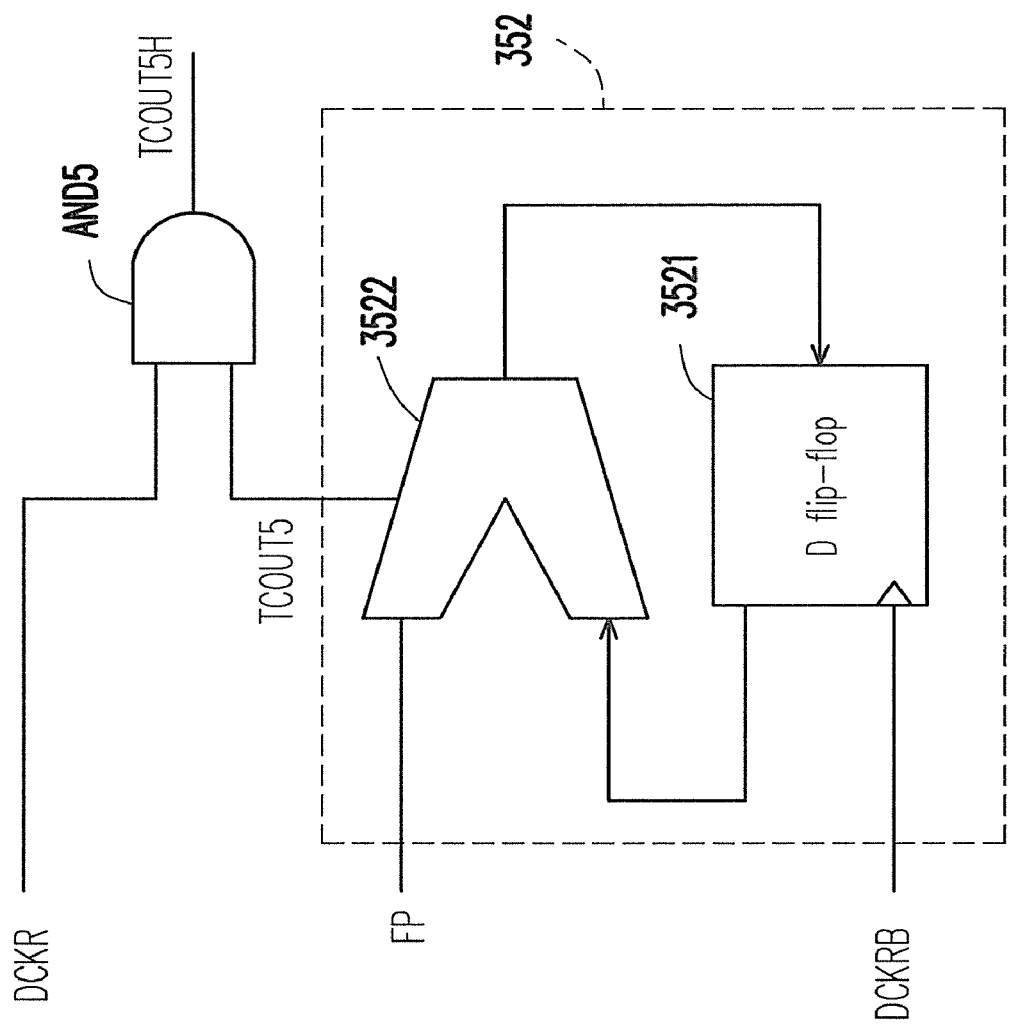
FIG. 5B is a circuit diagram of the accumulator 352 in the sigma-delta modulator 350 according to one embodiment of the present invention.

To understand detail of the operation of the accumulator 352, please simultaneously see FIGS. 5A and 5B. FIG. 5B is a circuit diagram of the accumulator 352 in the sigma-delta modulator 350 according to one embodiment of the present invention. In the embodiment, the accumulator 352 comprises a D flip-flop 3521 and an adder 3522. It is noted that the accumulator 352 cooperates with the frequency divider 351, and they equivalently function as an accumulator which quantization resolution is that of the accumulator 352 plus one bit. That is, the accumulator 352 of N bits will be equivalent to the accumulator of N+1 bits. The inversed frequency dividing reference clock signal DCKRB received by the accumulator 352 herein is generated from the reference clock signal CKR, wherein the frequency of the inversed frequency dividing reference clock signal DCKRB is divided from the frequency of the reference clock signal CKR. Since the frequency of the inversed frequency dividing reference clock signal DCKRB is the half of the reference clock signal CKR, the pulse width TCOUT5 of the output overflow signal OV is doubled. Then the and-gate AND5 regulates the pulse width of the output overflow signal OV to be same as the pulse width of the output overflow signal output from the accumulator of N+1 bits (i.e. the output signal TCOUT5H of the and-gate AND5). Hence, the accuracy of the N bits is equivalent to that of the N+1 bits, and the operating frequency of the clock generator is reduced, so as to save power consumption. The enhancing multiple of the accuracy of the equivalent technology is a positive integer which is larger than 1, and the effect of the accuracy enhancing is determined by the input frequency dividing modulus of the reference clock signal CKR, wherein the relation formulation is shown as:

$$\text{Accuracy} = \frac{FP}{2^N \times M}$$

, N is the data width of the original accumulator, and M is the input frequency dividing modulus of the frequency divider of the reference clock signal CKR. It is noted that the value of the factional part input signal FP is limited to be $2^N$. Therefore, the maximum modulating factor of the sigma-delta modulator is not equal to 1, but $2^N/(2^N \times M)$.

Figure 5C:
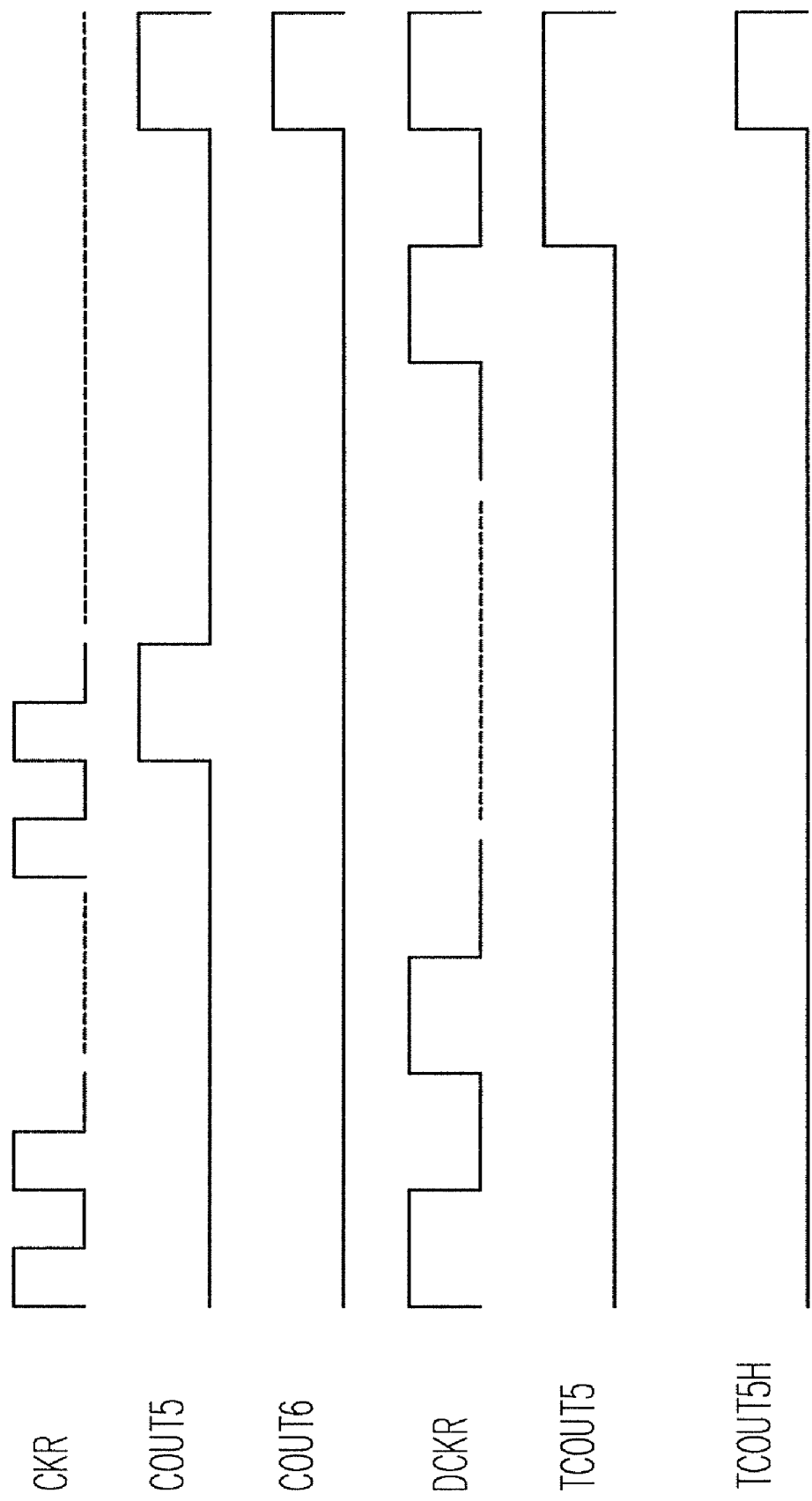
FIG. 5C is a waveform diagram of the waveforms in the accumulator 352.

Please see FIG. 5C, FIG. 5C is a waveform diagram of the waveforms in the accumulator 352. The signal COUT5 is the output overflow signal which is generated in response to the reference clock signal CKR by the original accumulator of 5 bits, and the signal COUT6 is the output overflow signal which is generated in response to the reference clock signal CKR by the original accumulator of 6 bits. The frequency of frequency dividing reference clock signal DCKR is the frequency of the reference clock signal divided by 2. The signal TCOUT5 is the output overflow signal generated by the inversed frequency dividing reference clock signal DCKRB, and thus the pulse width of the signal TCOUT5 is twice of the inversed frequency dividing reference clock signal DCKRB. Thus the and-gate AND5 is particularly used to change the pulse width of TCOUT5 to the half by and with DCKR, so as to obtain the waveform of the width adjusted output overflow signal TCOUT5H. The waveform of the width adjusted output overflow signal TCOUT5H is same as that of the signal COUT6.

Figure 5D:
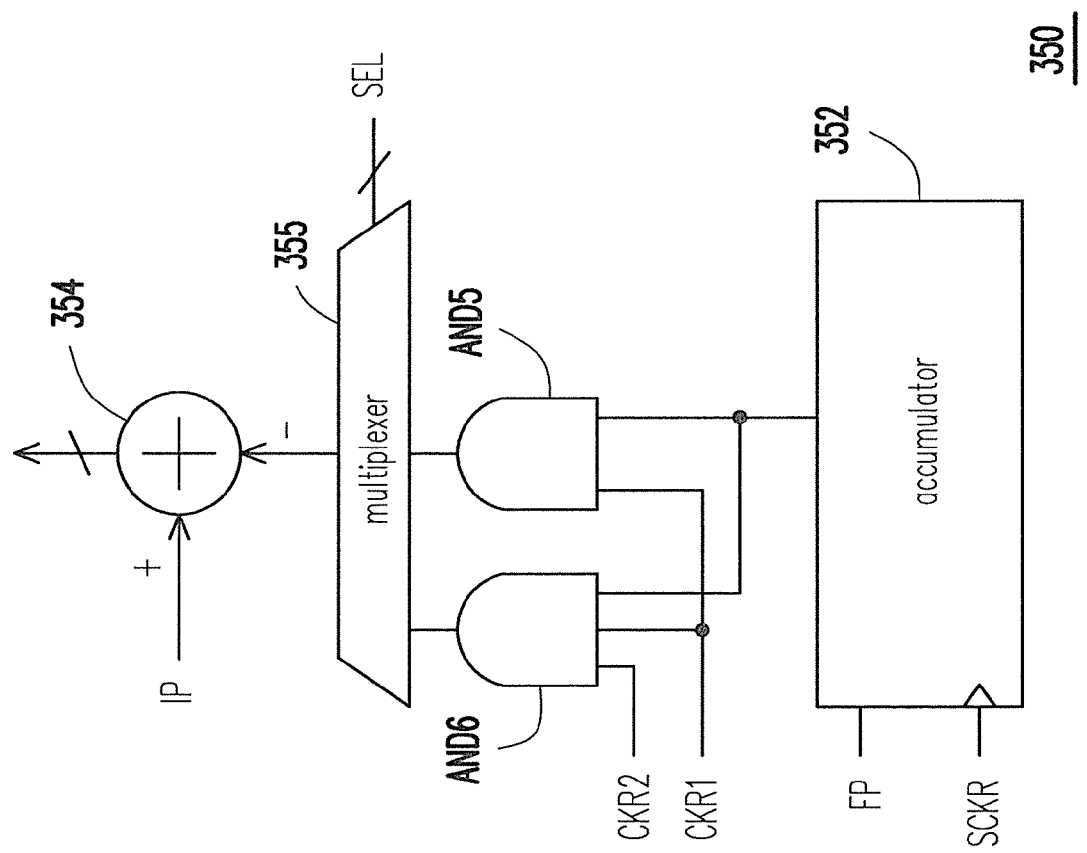
FIG. 5D is a circuit diagram of the sigma-delta modulator 350 according to another one embodiment of the present invention.

Please see FIG. 5D, FIG. 5D is a circuit diagram of the sigma-delta modulator 350 according to another embodiment of the present invention. In the embodiment, the frequencies reference clock signals CKR1 and CKR 2 are respectively the half and the quarter frequencies of the reference clock signal CKR. A multiplexer 355 and an and-gate AND 6 are inserted between accumulator 352 and the data calculating device 354 of the sigma-delta modulator 350. The multiplexer 355 is coupled between the and-gates (AND5 and AND6) and the data calculating device 354, and is used to select one of the width adjusted output overflow signals generated by the and-gates (AND5 and AND6, so as to output the selected one to the data calculating device 354. Meanwhile, a selector is added at the front of the end for receiving the input clock signal SCKR of the accumulator 352, and therefore the frequency dividing modulus can be selected. Accordingly, the equivalent bit width is changed by selecting the clock frequency rate and the pulse width of the output overflow signal of the sigma-delta modulator 350, thus the equivalent bit width of the sigma-delta modulator 350 is programmable, and the programmable spread spectrum function is achieved.

Figure 5E:
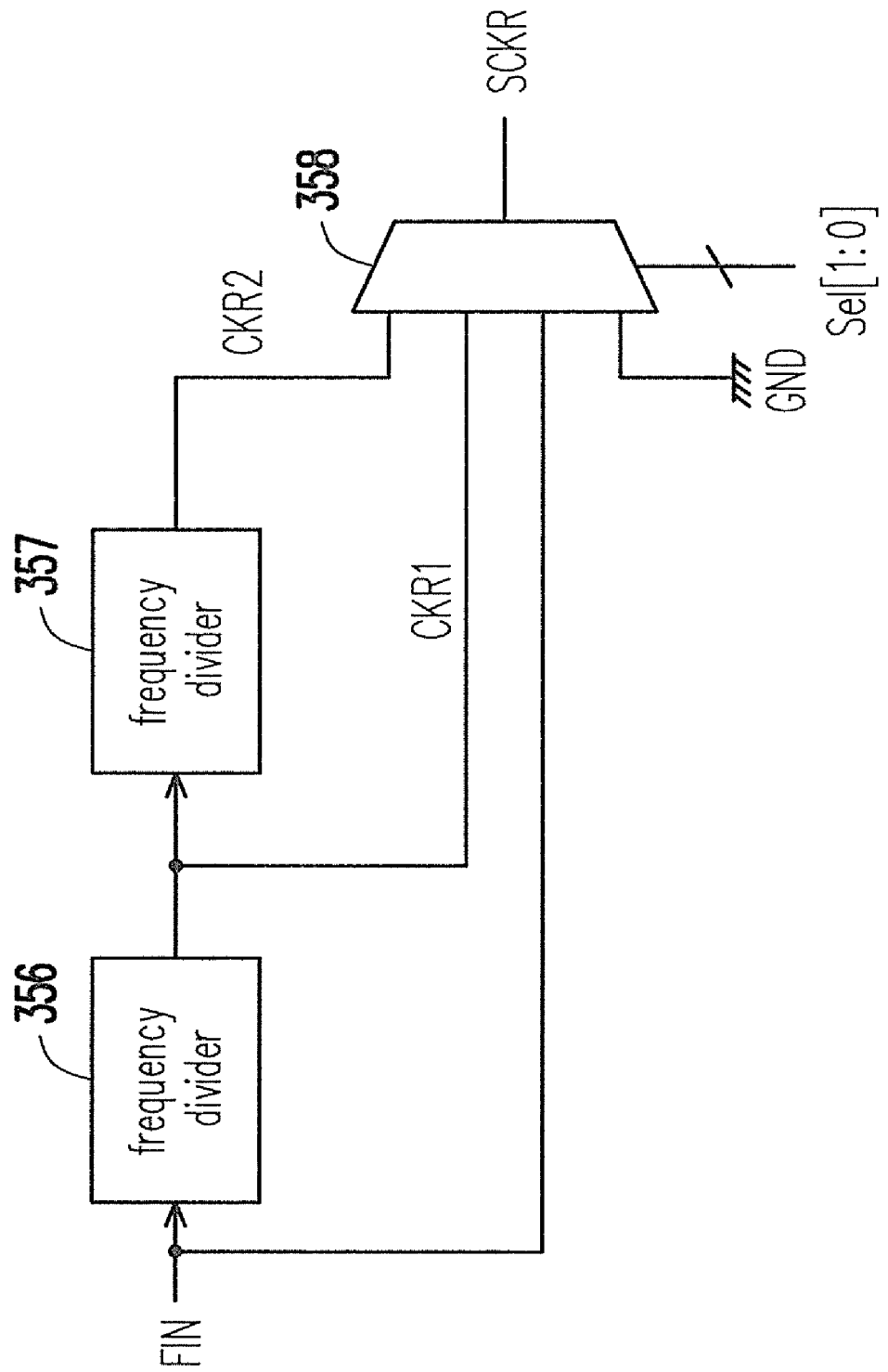
FIG. 5E is a circuit diagram of a device for generating the reference clock signals CKR1, CKR2, and the input clock signal in FIG. 5D according to one embodiment of the present invention.

In addition, regarding the generation of the reference clock signal CKR1 and CKR2, please refer to FIG. 5E, and FIG. 5E is a circuit diagram of a device for generating the reference clock signals CKR1, CKR2, and the input clock signal in FIG. 5D according to one embodiment of the present invention. The frequency of the reference clock signal CKR1 is divided from the input clock signal FIN by the frequency divider 356, and the frequency of the reference clock signal CKR2 is divided from the reference clock signal CKR1 by the frequency divider 357. In addition, the multiplexer 358 is coupled to the accumulator, and is used to receive the frequency dividing clock signals CKR1, CKR2, and the input clock signal FIN. The multiplexer 358 selects one of the reference clock signals CKR1, CKR2, the input clock signal FIN, and the system ground GND, so as to generate the input clock signal SCKR, and then the input clock signal SCKR is transmitted to the accumulator.

Figure 6:
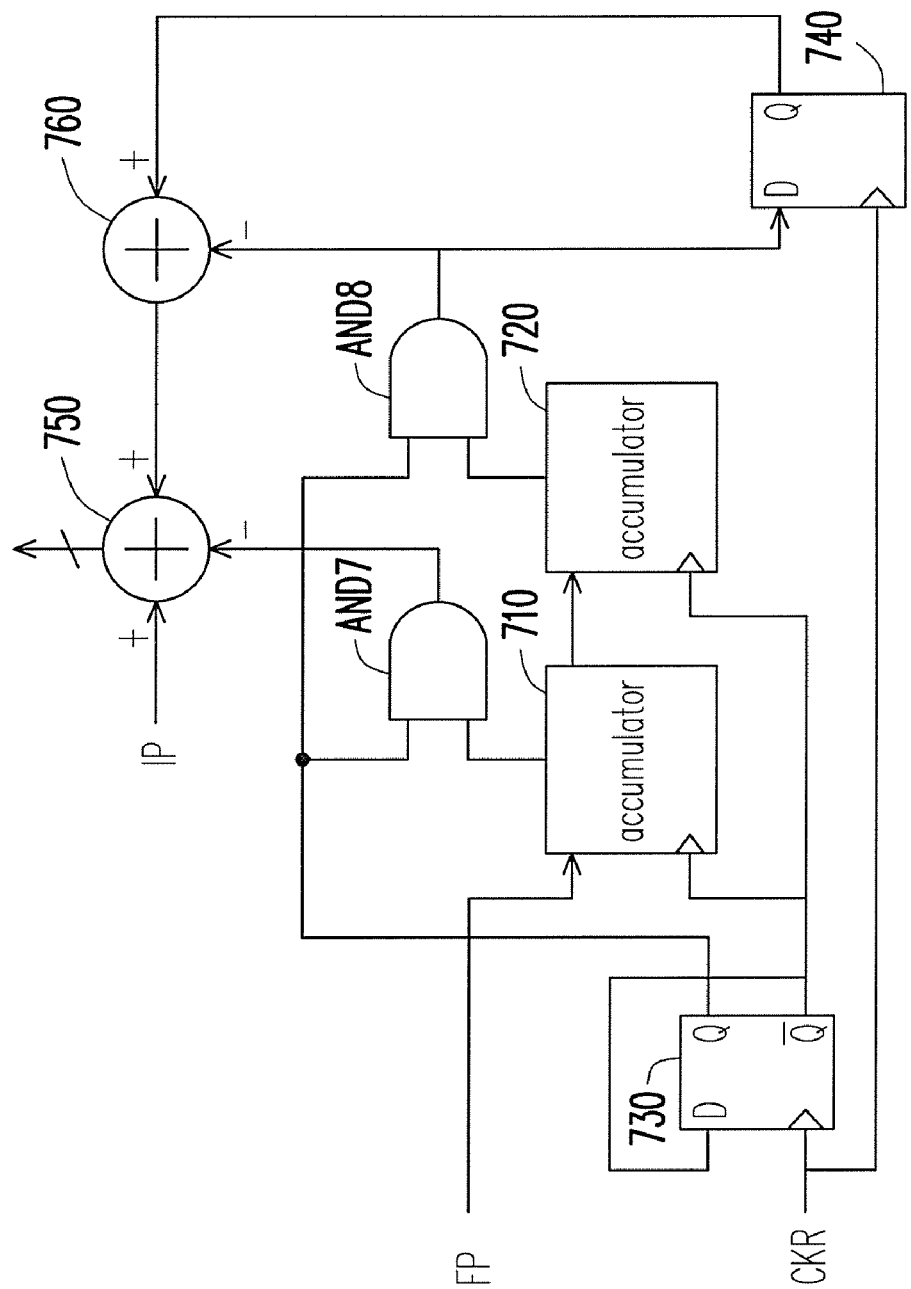
FIG. 6 is a circuit diagram of a second order sigma-delta modulator according to one embodiment of the present invention.

Next, a second order sigma-delta modulator is described, wherein the second order sigma-delta modulator is constructed by the two sigma-delta modulation unit. Referring to FIG. 6, FIG. 6 is a circuit diagram of a second order sigma-delta modulator according to one embodiment of the present invention. The second order sigma-delta modulator comprises two accumulators with N bits 710 and 720, and both of the accumulators with N bits 710 and 720 are connected in a cascade structure. Regarding the accumulator 720 of the second stage, a data calculating device 760, an and-gate AND8, and a D flip-flop 740 are added to process the output overflow signal generated by the accumulator 720. The output overflow signal generated by the accumulator 720 is transmitted to the and-gate AND8, so as to adjust the pulse width of the output overflow signal. The D flip-flop 740 is used to delay the output overflow signal, and the data calculating device 760 subtracts the output overflow signal from the delayed output overflow signal, so as to obtain a deviation result. The deviation result is transmitted to the data calculating device of the next stage, so as to perform an adding operation on the deviation result. Thus, the structure makes the sigma-delta modulator with N bits equivalent to the sigma-delta modulator with N+1 bits.

Figure 7:
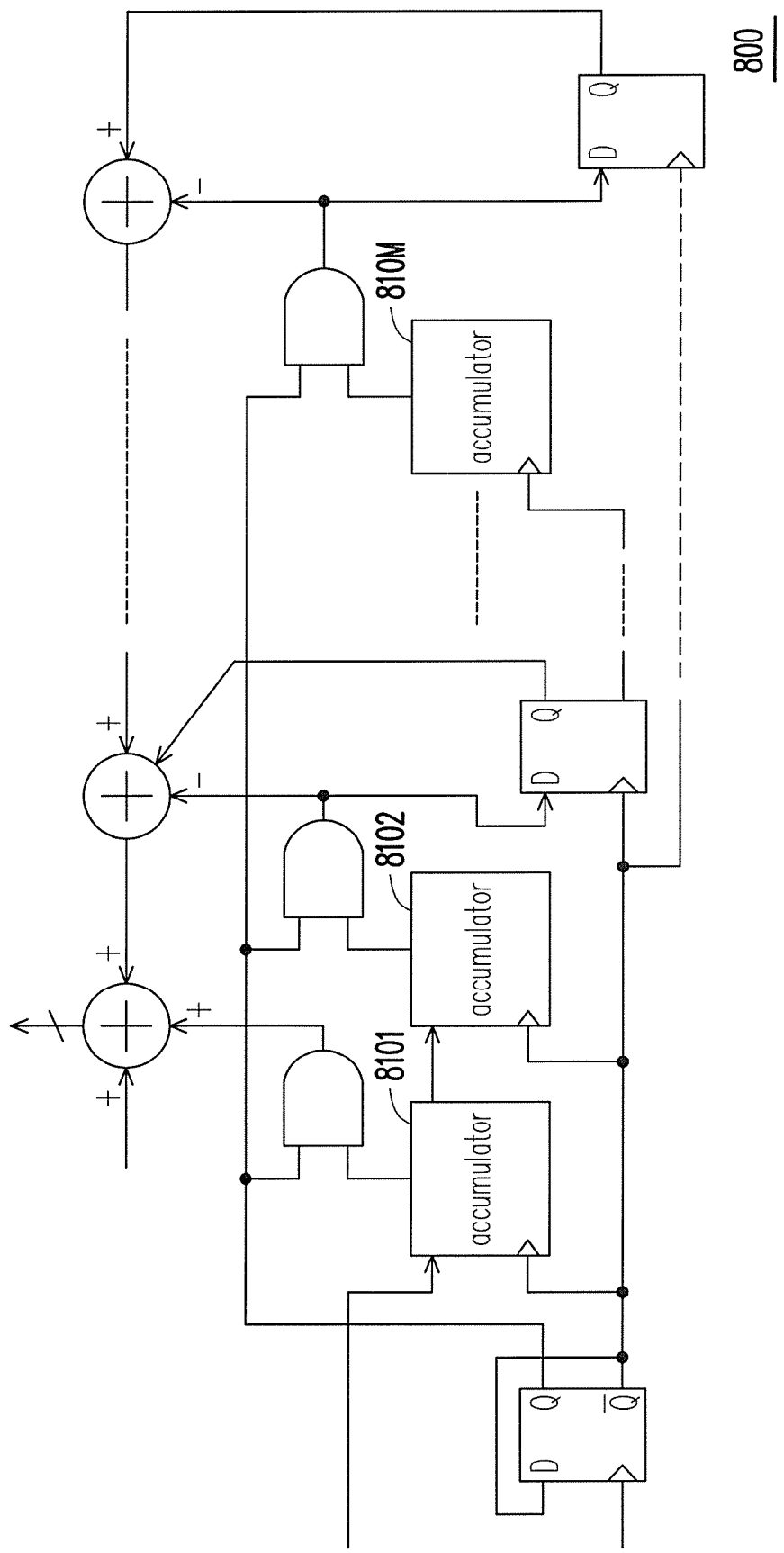
FIG. 7 is a circuit diagram of a M order sigma-delta modulator according to one embodiment of the present invention.

Next, the accumulators of the sigma-delta modulator can be connected to make it have more orders or only one order. Referring to FIG. 7, FIG. 7 is a circuit diagram of an M order sigma-delta modulator according to one embodiment of the present invention. The sigma-delta modulator 800 is formed by the cascade connection of the sigma-delta modulating units. The accumulators 8101-810M are connected in cascade by turns. Therefore, the function of expanding the sigma-delta modulating order is achieved, and the ability of the regulating the quantization error is enhanced.

Accordingly, the embodiment adapts the multimodulus frequency divider and the sigma-delta modulator with enhanced accuracy to improve the accuracy and the stability of the clock generator. The multimodulus frequency divider implemented by switching the phase thereof has the non-integral resolution, thus the operating frequency of the clock generator is increased, and the output jitter caused by spreading the spectrum thereof is reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A multimodulus frequency divider, comprising a plurality of multimodulus frequency dividing units connected in series, and the multimodulus frequency divider comprises:
   an input phase selection unit, receiving a plurality of synchronous input signals and a selection signal, selecting a phase of one synchronous input signal among the synchronous input signals in response to the selection signal, so as to generate a selected synchronous input signal;
   a frequency dividing and phase generating unit, coupled to the input phase selection unit, receiving the selected synchronous input signal, and dividing a frequency of the selected synchronous input signal, so as to obtain an output multimodulus frequency dividing signal;
   a phase selection control unit, coupled to the frequency dividing and phase generating unit of the last multimodulus frequency dividing unit, receiving the output multimodulus frequency dividing signal and a control signal, and taking the output multimodulus frequency dividing signal and the control signal into a logic calculation, so as to generate a feedback signal; and
   a phase state selection unit, coupled to the phase selection control unit, changing a state of the selection signal into another state or maintaining the state of the selection signal in response to whether the feedback signal is triggered or not, so as to generate a recording phase signal.

2. A multimodulus frequency divider according to claim 1, further comprising:
   an input phase synchronization unit, receiving a plurality of input signals, and synchronizing the input signals, so as to generate the synchronous input signals, and the phase differences of the synchronous input signals are not equal to zero.

3. A multimodulus frequency divider according to claim 2, wherein the input phase synchronization unit is a delay buffer, and the delay buffer comprises:
   a plurality of delay units, receiving the input signals, and generating the synchronous input signals.

4. A multimodulus frequency divider according to claim 1, wherein the input phase selection unit is a selector, the selector comprises a plurality of input ends for receiving the synchronous input signals, the selector selecting the phase of the one synchronous input signal among the synchronous input signals in response to the selection signal, so as to generate the selected synchronous input signal on an output end of the selector.

5. A multimodulus frequency divider according to claim 1, wherein the frequency dividing and phase generating unit is a first frequency divider, the first frequency divider receives the selected synchronous input signal, and generates the output multimodulus frequency dividing signal.

6. A multimodulus frequency divider according to claim 1, further comprising:
   at least a phase selection signal synchronization unit, coupled to the phase state selection unit and the input phase selection unit, synchronizing the recording phase signal in response to one of the input signals, so as to generate the selection signal.

7. A multimodulus frequency divider according to claim 6, wherein the phase selection signal synchronization unit comprises a D flip-flop, the D flip-flop comprises a data end, a clock end, and an output end, the output end of the D flip-flop outputs the selection signal, the clock end of the D flip-flop receives one of the input signals, and the data end of the D flip-flop receives the recording phase signal.

8. A multimodulus frequency divider according to claim 1, wherein the phase state selection unit is a second frequency divider.

9. A multimodulus frequency divider according to claim 1, wherein the phase selection control unit is an and-gate, input ends of the and-gate receives the multimodulus frequency dividing signal and the control signal, and an output end of the and-gate outputs the feedback signal.

10. A clock generator, constructed by a phase locked loop circuit, generating an output clock signal in response to the input clock signal and a feedback clock signal, the feedback clock signal and the output clock signal have a multiple relation, and the clock generator comprises:
    a multimodulus frequency divider, generating the multiple relation in response to a control signal, comprising a plurality of frequency dividing units connected in series, and the multimodulus frequency divider comprises:
an input phase selection unit, receiving a plurality of synchronous input signals and a selection signal, selecting a phase of one synchronous input signal among the synchronous input signals in response to the selection signal, so as to generate a selected synchronous input signal;
a frequency dividing and phase generating unit, coupled to the input phase selection unit, receiving the selected synchronous input signal, and dividing a frequency of the selected synchronous input signal, so as to obtain the feedback clock signal;
a phase selection control unit, coupled to the frequency dividing and phase generating unit of the last frequency dividing unit, receiving feedback clock signal and the control signal, and taking the feedback clock signal and the control signal into a logic calculation, so as to generate a feedback signal; and
a phase state selection unit, coupled to the phase selection control unit, changing a state of the selection signal into another state or maintaining the state of the selection signal in response to whether the feedback signal is triggered or not, so as to generate a recording phase signal.

11. A clock generator according to claim 10, further comprising:
an input phase synchronization unit, receiving a plurality of input signals, and synchronizing the input signals, so as to generate the synchronous input signals, wherein the phase differences of the synchronous input signals are not equal to zero, and one of the input signals is the output clock signal.

12. A clock generator according to claim 11, wherein the input phase synchronization unit is a delay buffer, and the delay buffer comprises:
a plurality of delay units, receiving the input signals, and generating the synchronous input signals.

13. A clock generator according to claim 10, wherein the input phase selection unit is a selector, the selector comprises a plurality of input ends for receiving the synchronous input signals, the selector selecting the phase of the one synchronous input signal among the synchronous input signals in response to the selection signal, so as to generate the selected synchronous input signal on an output end of the selector.

14. A clock generator according to claim 10, wherein the frequency dividing and phase generating unit is a first frequency divider, the first frequency divider receives the selected synchronous input signal, and generates the feedback clock signal.

15. A clock generator according to claim 10, further comprising:
a phase selection signal synchronization unit, coupled to phase state selection unit, synchronizing the recording phase signal in response to one of the input signals, so as to generate the selection signal.

16. A clock generator according to claim 15, wherein the phase selection signal synchronization unit comprises a D flip-flop, the D flip-flop comprises a data end, a clock end, and an output end, the output end of the D flip-flop outputs the selection signal, the clock end of the D flip-flop receives one of the input signals, and the data end of the D flip-flop receives the recording phase signal.

17. A clock generator according to claim 10, wherein the phase state selection unit is a second frequency divider.

18. A clock generator according to claim 10, wherein the phase selection control unit is an and-gate, input ends of the and-gate receives the feedback clock signal and the control signal, and an output end of the and-gate outputs the feedback signal.

19. A clock generator according to claim 10, further comprising at least a sigma-delta modulator, the sigma-delta modulator is coupled to the multimodulus frequency divider, and is used to output the control signal.

20. A clock generator according to claim 19, wherein the sigma-delta modulator, comprises:
a frequency dividing circuit, receiving an input clock signal, and dividing a frequency of the input clock signal, so as to generate a frequency dividing clock signal;
an accumulator, coupled to the frequency dividing circuit, receiving the frequency dividing clock signal, and accumulating a fractional part input signal in response to the frequency dividing clock signal, so as to generate a quantized output signal and an output overflow signal;
a pulse width adjusting circuit, coupled to the accumulator, receiving the output overflow signal and the frequency dividing clock signal, and adjusting a pulse width of the output overflow signal in response to a period of the frequency dividing clock signal, so as to generate a width adjusted output overflow signal; and
a data calculating device, coupled to the pulse width adjusting circuit, taking the width adjusted output overflow signal and an integral part input signal into an algorithmic calculation, so as to generate the control signal.

21. A clock generator according to claim 20, wherein the pulse width adjusting circuit is an and-gate, input ends of the and-gate respectively receive the output overflow signal and the frequency dividing clock signal, and an output end of the and-gate outputs the width adjusted output overflow signal.

22. A clock generator according to claim 20, wherein the control signal generated by the data calculating device outputs is obtained by subtracting the width adjusted output overflow signal from the integral part input signal.

23. A clock generator according to claim 20, wherein when the sigma-delta modulator comprising the pulse width adjusting circuits, the sigma-delta modulator further comprises:
a first multiplexer, coupled between the pulse width adjusting circuits and the data calculating device, used to select one of the output overflow signals generated by the pulse width adjusting circuits, and to transmit the selected output overflow signal to the data calculating device.

24. A clock generator according to claim 23, wherein when the sigma-delta modulator comprising a plurality of frequency dividing circuits, the sigma-delta modulator further comprises:
a second multiplexer, coupled between the accumulators and a plurality of the frequency dividing clock signals generated by the frequency dividing circuits, used to select one of the frequency dividing clock signals, and to transmit the selected frequency dividing clock signal to the accumulators.

* * * * *

UNITED STATES PATENT AND TRADEMARK OFFICE
CERTIFICATE OF CORRECTION

PATENT NO. : 7,924,965 B2
APPLICATION NO. : 12/391263
DATED : April 12, 2011
INVENTOR(S) : Wei-Sheng Tseng et al.

It is certified that error appears in the above-identified patent and that said Letters Patent is hereby corrected as shown below:

Title page, Item (54) and in the Specification at Column 1, lines 1-3, Title of the Invention:

"CLOCK GENERATOR, MULTIMODULUS FREQUENCY DIVIDER AND DETA-SIGMA MODULATER THEREOF"

should be:

--CLOCK GENERATOR, MULTIMODULUS FREQUENCY DIVIDER AND DELTA-SIGMA MODULATOR THEREOF--.

Signed and Sealed this
Nineteenth Day of November, 2013

Teresa Stanek Rea
*Deputy Director of the United States Patent and Trademark Office*